US006679708B1

(12) United States Patent
Depp et al.

(10) Patent No.: US 6,679,708 B1
(45) Date of Patent: Jan. 20, 2004

(54) VEHICLE JUNCTION BOX HAVING POWER DISTRIBUTION CENTER WITH TERMINAL FOR JUMP-STARTING VEHICLE

(75) Inventors: Charles P. Depp, Saline, MI (US); J. Patrick Dunbar, Jr., Farmington Hills, MI (US); Bernadette Y. Palmer, Ida, MI (US); John M. King, Northville, MI (US); Joseph A. Mauney, Livonia, MI (US)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 10/238,560

(22) Filed: Sep. 10, 2002

(51) Int. Cl.[7] ............................ H05K 5/00; H01R 12/00
(52) U.S. Cl. ..................... 439/76.2; 361/826; 361/752
(58) Field of Search ............................. 439/76.2, 76.1; 361/826, 752, 622

(56) References Cited

U.S. PATENT DOCUMENTS

| | | | | |
|---|---|---|---|---|
| 5,882,213 A | * | 3/1999 | Witek et al. ............... 439/76.2 |
| 6,077,102 A | * | 6/2000 | Borzi et al. ................ 439/76.2 |
| 6,116,916 A | * | 9/2000 | Kasai ......................... 439/76.2 |
| 6,322,376 B1 | * | 11/2001 | Jetton ......................... 439/76.2 |
| 6,430,054 B1 | * | 8/2002 | Iwata .......................... 439/76.2 |
| 6,430,055 B2 | * | 8/2002 | Saito ........................... 361/752 |
| 6,437,986 B1 | * | 8/2002 | Koshiba ...................... 361/752 |

* cited by examiner

Primary Examiner—Gary Paumen
(74) Attorney, Agent, or Firm—Harness, Dickey & Pierce, P.L.C.

(57) ABSTRACT

A junction box assembly for a vehicle having a junction box, a positive conductive terminal, a bus bar and a conductive jump-start terminal that are coupled to a battery cable in a manner wherein high-current electrical energy does not flow though the junction box during a jump-start event. The jump-start terminal is configured with a blade portion that provides the user of the vehicle with a convenient point to which the positive lead of a jumper cable may be attached during jump-starting operations.

19 Claims, 5 Drawing Sheets

VEHICLE JUNCTION BOX HAVING POWER DISTRIBUTION CENTER WITH TERMINAL FOR JUMP-STARTING VEHICLE

FIELD OF THE INVENTION

The present invention generally relates vehicle electrical systems and more particularly to an improved junction box assembly having a conductive terminal that provides the user of the vehicle with a convenient and readily grippable point to which the positive lead of a jumper cable may be attached during jump-starting operations.

BACKGROUND OF THE INVENTION

For nearly a century, the internal combustion engine of automotive vehicles have been started with electric starters. In a typical automotive vehicle, the electric starter is coupled to an electrical system that includes a battery for storing electrical energy and an electrical energy generating device, such as an alternator, which is employed to charge the battery. In situations where the level of energy that is stored in the battery drops below that which is required to operate the electric starter, as when the vehicle's headlights are left on for an extended period of time while the vehicle is not running, the vehicle operator will not be able to start the internal combustion engine of the vehicle in the normal manner (i.e., by simply rotating a key switch). In such situations, it is relatively common to jump-start the vehicle, wherein a set of jumper cables are employed to electrically couple the vehicle battery to a booster battery. The booster battery may be the battery of another vehicle or the battery of a self-contained jump-start unit.

In late model vehicles, it was fairly common for the batteries to have tapered cylindrical post-like terminals extending from a top surface of the battery. The positioning of the post-like terminals and the battery cables that were attached to them rendered the task of coupling the positive jaw of a set of jumper cables to the battery a relatively simple and easy task. In modern vehicles, however, the battery typically employs flush-mount terminals that incorporate a female-threaded boss to which the battery cables are coupled. Further complicating matters, these terminals are typically mounted on the side of the battery and the battery is frequently compactly packaged within the engine compartment such that it is surrounded by various components so that access to the terminals can be extremely difficult.

Another consideration when jump-starting a vehicle concerns the oxygen and hydrogen gases that are produced during the charging of the battery. If a spark is generated in the immediate vicinity of the battery, it is possible for these gases to ignite. Accordingly, it would be advantageous to provide a remotely located, conveniently located terminal to which the positive jaw of a jumper cable set could be securely coupled when jump-starting a vehicle.

SUMMARY OF THE INVENTION

In one preferred form, the present invention provides an electrical junction box assembly having a junction box, a jump-start terminal and a conductive positive terminal. The junction box defines a mounting aperture and includes a bus bar. The jump-start terminal is disposed in the mounting aperture and includes a blade portion that is configured to be gripped by a jaw of a jumper cable. The jump-start terminal also defines a coupling aperture. The conductive positive terminal has a head portion and a threaded portion, wherein the head portion is disposed in the coupling aperture and matingly engaged to the jump-start terminal to prevent relative rotation therebetween. The threaded portion, which is formed along a terminal axis, extends from the head portion and is adapted to electrically couple the conductive positive terminal to a positive conductor of an associated battery cable. The threaded portion of the conductive positive terminal extends through the bus bar and the bus bar abuts both the head portion of the conductive positive terminal and the jump-start terminal.

In another preferred form, the present invention provides an electrical junction box assembly having a junction box, a mounting aperture, a jump-start terminal and a conductive positive terminal. The junction box has a lower case and a circuit board, which includes a board member that is constructed of an electrically insulating material. The mounting aperture formed into one of the lower case and the board member. The jump-start terminal has a mounting portion and a blade portion. The mounting portion is received into the mounting aperture such that the one of the lower case and the board member inhibits rotation of the jump-start terminal relative to the junction box. The blade portion has a pair of opposite faces that are generally parallel one another. The conductive positive terminal is in direct contact with the jump-start terminal and is adapted for electrical connection to a positive conductor of a battery cable. The conductive positive terminal is spaced apart from the blade portion of the jump-start terminal.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Additional advantages and features of the present invention will become apparent from the subsequent description and the appended claims, taken in conjunction with the accompanying drawings, wherein:

DETAILED DESCRIPTION OF THE PREFERRED EMBODIMENTS

Figure 1:
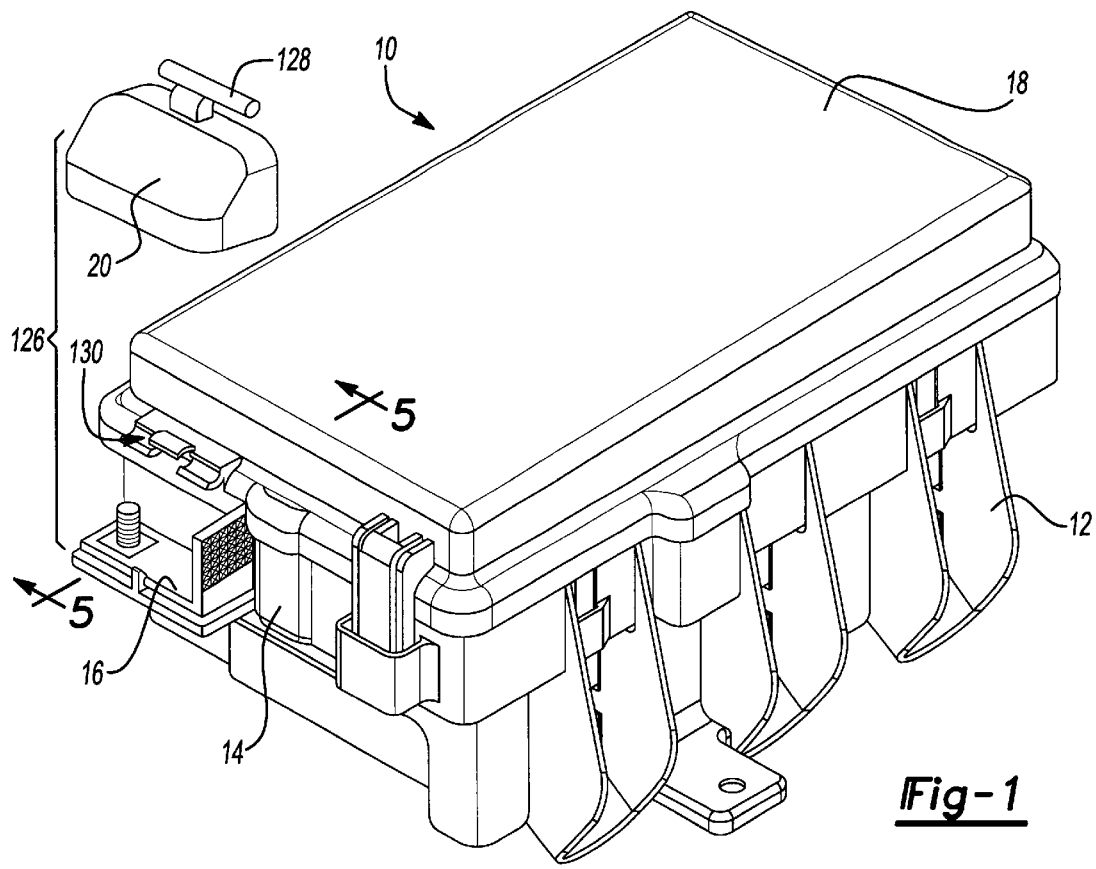
FIG. 1 is a perspective view of a portion of a junction box assembly constructed in accordance with the teachings of the present invention.
Figure 2A:
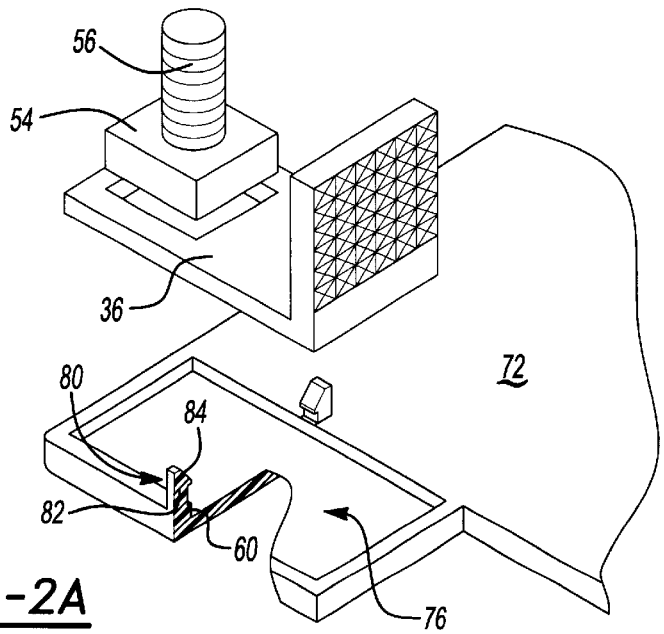
FIG. 2A is an enlarged exploded and partially broken away view of the junction box assembly of FIG. 1.
Figure 2:
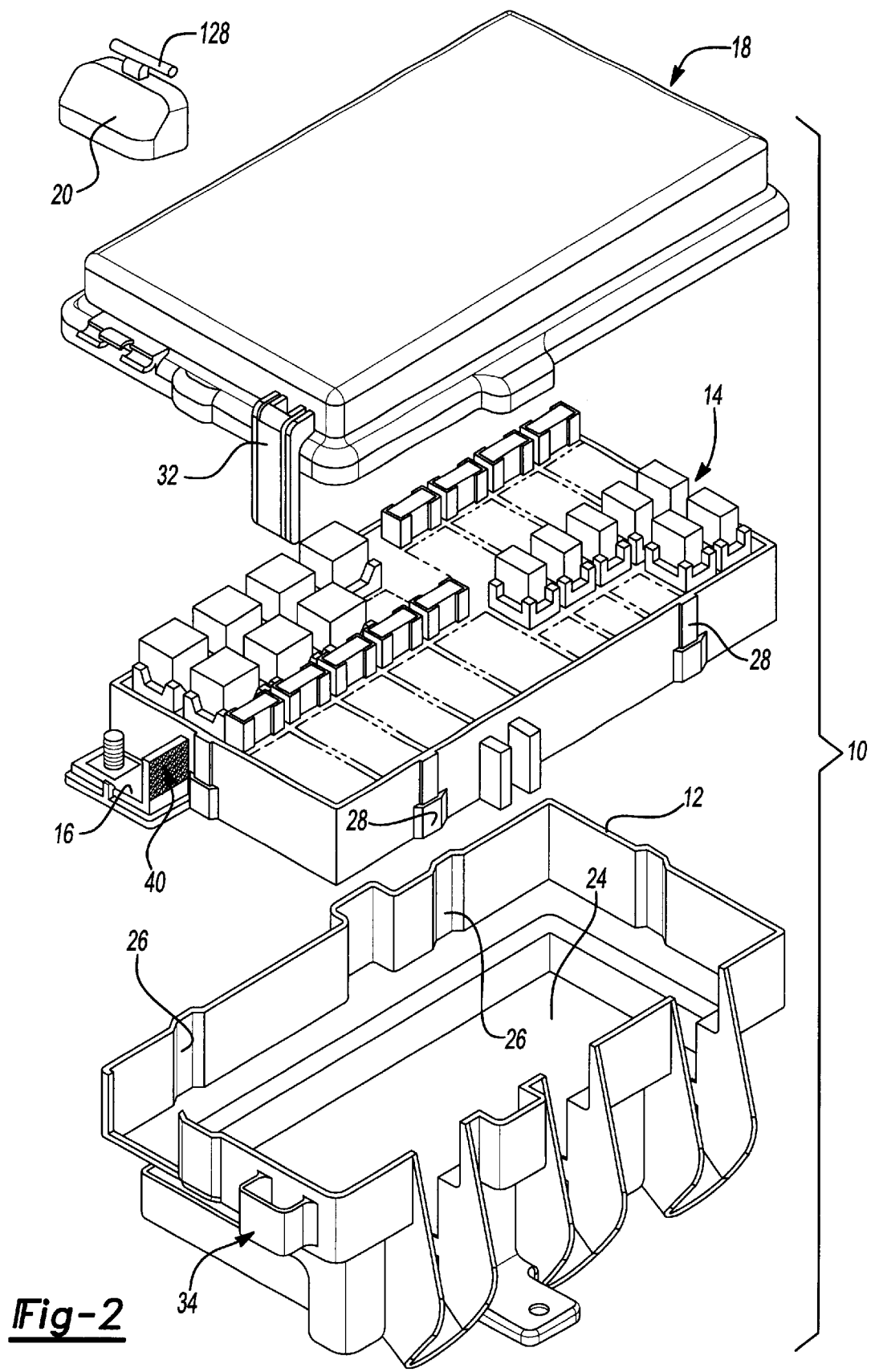
FIG. 2 is an exploded perspective view of a junction box assembly of FIG. 1.

With reference to FIGS. 1 and 2 of the drawings, a junction box assembly constructed in accordance with the teachings of the present invention is generally indicated by reference numeral 10. The junction box assembly 10 is illustrated to include a junction box shroud 12, a junction box 14, jump-start terminal 16, a junction box cover 18 and a jump-start cover 20.

The junction box shroud 12 and the junction box cover 18 are conventional in their construction and operation. In the particular embodiment illustrated, the junction box shroud 12 is a unitarily formed, injection molded structure that defines a junction box cavity 24 that is configured to receive the junction box 14. A plurality of tab receiving slots 26 are formed about the inner perimeter of the junction box shroud 12. Each of the tab receiving slots 26 is configured to receive an associated alignment tab 28 that is formed on the perimeter of the junction box 14. The tab receiving slots 26 and the alignment tabs 28 cooperate to permit the junction box 14 to engage the junction box shroud 12 in a conventional snap-fit manner. One suitable configuration of the tab receiving slots 26 and the alignment tabs 28 is illustrated and discussed in copending and commonly assigned U.S. patent application Ser. No. 10/097,228 entitled "Junction Box Assembly", the disclosure of which is hereby incorporated by reference as if fully set forth herein.

The junction box cover 18 is likewise unitarily formed in an injection molding operation and is configured to be removably secured to the junction box shroud to thereby cover a portion of the junction box 14. More specifically, the junction box cover 18 includes a plurality of conventional retaining tabs 32, each of which matingly, but releasably engages an associated retaining tang 34 that is formed on the exterior surface of the junction box shroud 12.

Figure 3:
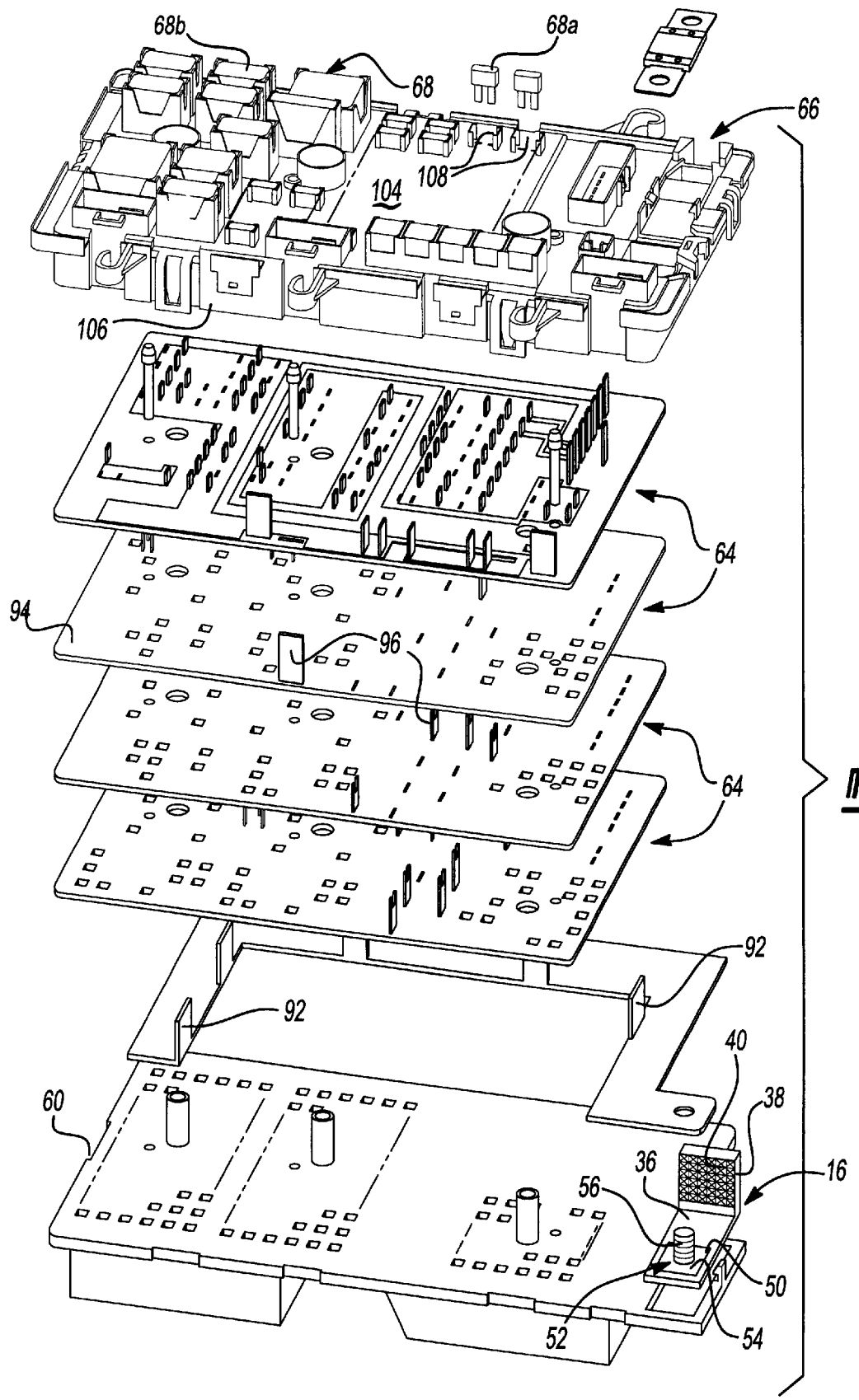
FIG. 3 is an exploded perspective view of a portion of the junction box assembly of FIG. 1 illustrating the junction box in greater detail.
Figure 4:
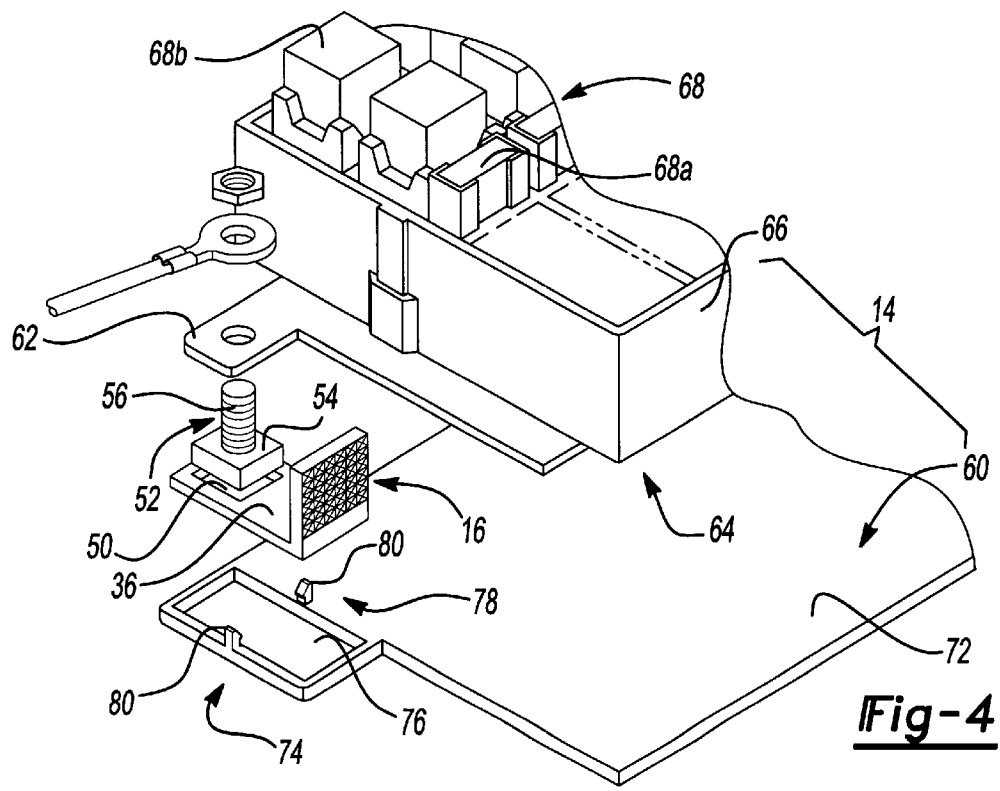
FIG. 4 is an exploded perspective view of a portion of the junction box assembly of FIG. 1 illustrating in greater detail the incorporation of the jump-start terminal.

The jump-start terminal 16 is formed from a conductive material, such as brass, and is illustrated in FIGS. 3 and 4 to include a base portion 36 and a blade portion 38. In the particular example provided, the blade portion 38 is arranged generally perpendicularly to the base portion 36 to thereby give the jump-start terminal 16 a generally L-shape. Those skilled in the art will appreciate, however, that the blade portion 38 may be arranged in any appropriate orientation relative to the base portion 36, such as parallel or skewed by an angle of less than or more than 90 degrees, that provides access to the blade portion 38 with the clamp or jaw of a jumper cable as will be discussed in greater detail, below. Preferably, one or both of the opposite faces 40 of the blade portion 38 are formed with a friction enhancing feature to ensure that the jaw of the jumper cable will remain engaged to the blade portion 38. In the example provided, the friction enhancing feature includes a plurality of lines (e.g., checkering or knurling) that are stamped into the faces 40 of the blade portion 38 during the fabrication of the jump-start terminal.

Figure 7:
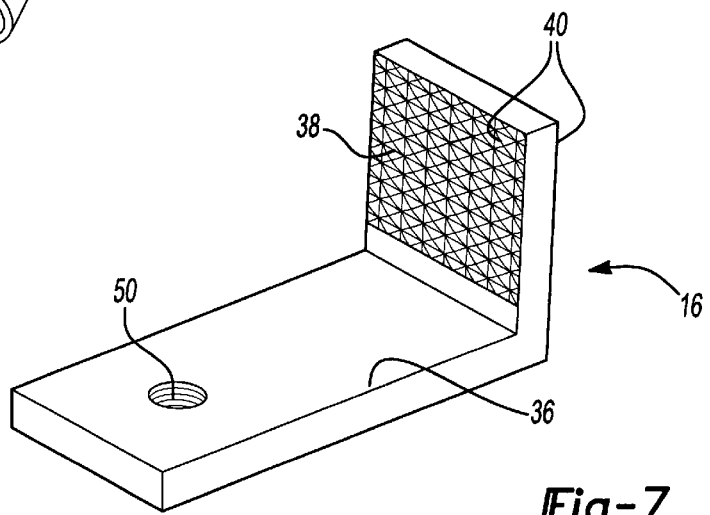
FIG. 7 is a perspective view of an alternately constructed jump-start terminal.

The base portion 36 includes a coupling aperture 50 that permits the jump-start terminal to be coupled to the conductive positive terminal 52 of the junction box 14. Accordingly, the coupling aperture 50 may be a threaded aperture into which the conductive positive terminal 52 is threaded as illustrated in FIG. 7. In the example of FIGS. 3 and 4, the conductive positive terminal 52 includes a head portion 54 and a threaded portion 56 and the coupling aperture 50 is a hole that is sized to engage the head portion 54 of the conductive positive terminal 52. The head portion 54, which is square in shape, is received into the coupling aperture 50, which is also square in shape and sized just slightly larger than the head portion 54. Alternatively, the coupling aperture 50 may be a hole that is, for example, square or hexagonal in shape and sized so as to matingly receive a conventional square or hexagonal nut into which the conductive positive terminal 52 may be threaded.

The junction box 14 is illustrated to include a lower case 60, the conductive positive terminal 52, a bus bar 62, a plurality of circuit boards 64, an upper case 66 and a plurality of electrical components 68 that include, for example, fuses 68a and relays 68b. The lower case 60 is an injection molded component that includes a first case portion 72, which conventionally serves as a base for supporting the circuit boards 64, and a second case portion 74.

With additional reference to FIG. 2A, the second case portion 74 includes a mounting recess or aperture 76 and a retaining mechanism. The mounting aperture 76 does not extend through the lower case 60 and is sized to receive the base portion 36 of the jump-start terminal 16. In the particular embodiment provided, the retaining mechanism includes a pair of fingers 80 that are resiliently coupled to the second case portion 74 in an area proximate the mounting aperture 76. Each finger 80 includes a leg portion 82, which extends generally perpendicularly away from the lower case 60, and a tab 84 that is coupled to the distal end of the leg portion 82 and which overlies the mounting aperture 76.

The fingers 80 are configured to bend outwardly away from the mounting aperture 76 when the base portion 36 of the jump-start terminal 16 is inserted to the mounting aperture 76, but thereafter return to a position wherein the tabs 84 overlie the mounting aperture 76 and the base portion 36 of the jump-start terminal 16 to thereby resist the removal of the jump-start terminal 16 from the mounting aperture 76 prior to the installation of the junction box 14 into the vehicle and the coupling of the conductive positive terminal 52 with a positive battery cable 90.

With the jump-start terminal 16 disposed in the mounting aperture 76 and coupled to the lower case 60 and the head portion 54 of the conductive positive terminal 52 disposed in the coupling aperture 50, the bus bar 62 is positioned over the threaded portion 56 of the conductive positive terminal 52 and abutted against the head portion 54 and the base portion 36 of the jump-start terminal 16. The bus bar 62 includes a plurality of legs 92 that facilitate the transmission of electrical to the plurality of circuit boards 64 that are overlaid onto the bus bar 62.

The basic construction of the circuit boards 64 and their coupling to the lower case 60 is conventional and as such, a detailed discussion of their construction is not needed, as this is well within the capabilities of one skilled in the art. Briefly, each of the circuit boards 64 include a board member 94, which is constructed from an electrically insulating material, and a plurality of electrical contacts 96 that are configured to distribute electrical power through the circuit board 64 and/or between circuit boards 64 in a predetermined manner. Several of the electrical contacts 96 extend below the lower case 60 and form the electrical contacts that are to be electrically coupled to a connector end (not shown) of a wire harness (not shown). The engagement of the electrical contacts 96 into the adjacent circuit boards 64 produces a locking effect which tends to inhibit the circuit boards 64 from moving relative to one another.

Figure 5:
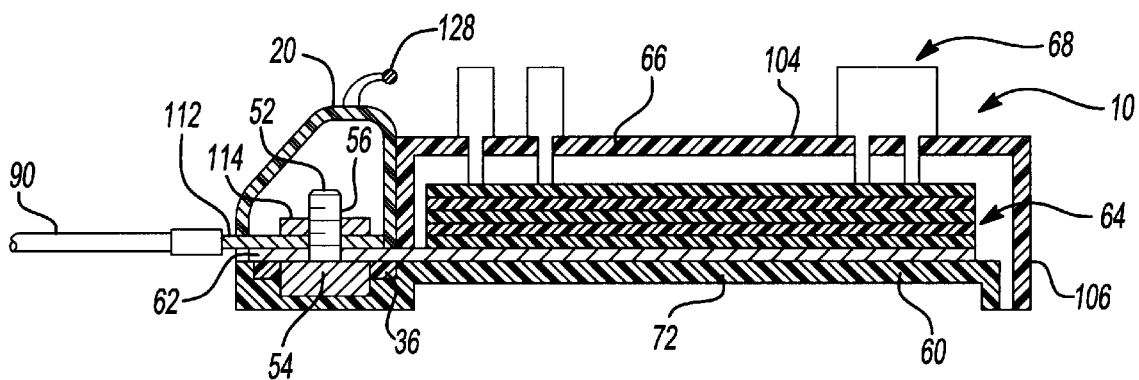
FIG. 5 is a sectional view taken along the line 5—5 of FIG. 1.

With additional reference to FIG. 5, the upper case 66 includes a substantially horizontal portion 104 that overlies the circuit boards 64 and the first case portion 72, as well as a wall member 106 that shrouds the perimeter of the circuit boards 64. Threaded fasteners (not shown) may be employed to fixedly but removably couple the upper case 66 to the lower case 60 in a conventional manner that is discussed in detail in the above-mentioned copending U.S. patent application Ser. No. 10/097,228 entitled "Junction Box Assembly".

A plurality of electrical component recesses 108 are formed into the horizontal portion 104 and are configured to receive an associated one of the electrical components 68. The construction and use of the electrical component recesses 108 is conventional and well within the level of skill in the art and as such, a detailed discussion of their construction need not be provided. Briefly, modern high-volume vehicle manufacturing techniques favor the use of highly assembled modules or components to the vehicle assembly line so as to facilitate the efficient and reliable assembly of vehicles. In this regard, it is desired that all of the electrical components 68 be coupled to the junction box 14 prior to its delivery to the vehicle assembly line for the installation to a vehicle. The various fuses 68a and relays 68b, etc. are placed in an associated electrical component recess 108 and coupled to the electrical contacts 96 of the circuit boards 64 to fixedly but removably engage them to the upper case 66.

Figure 6:
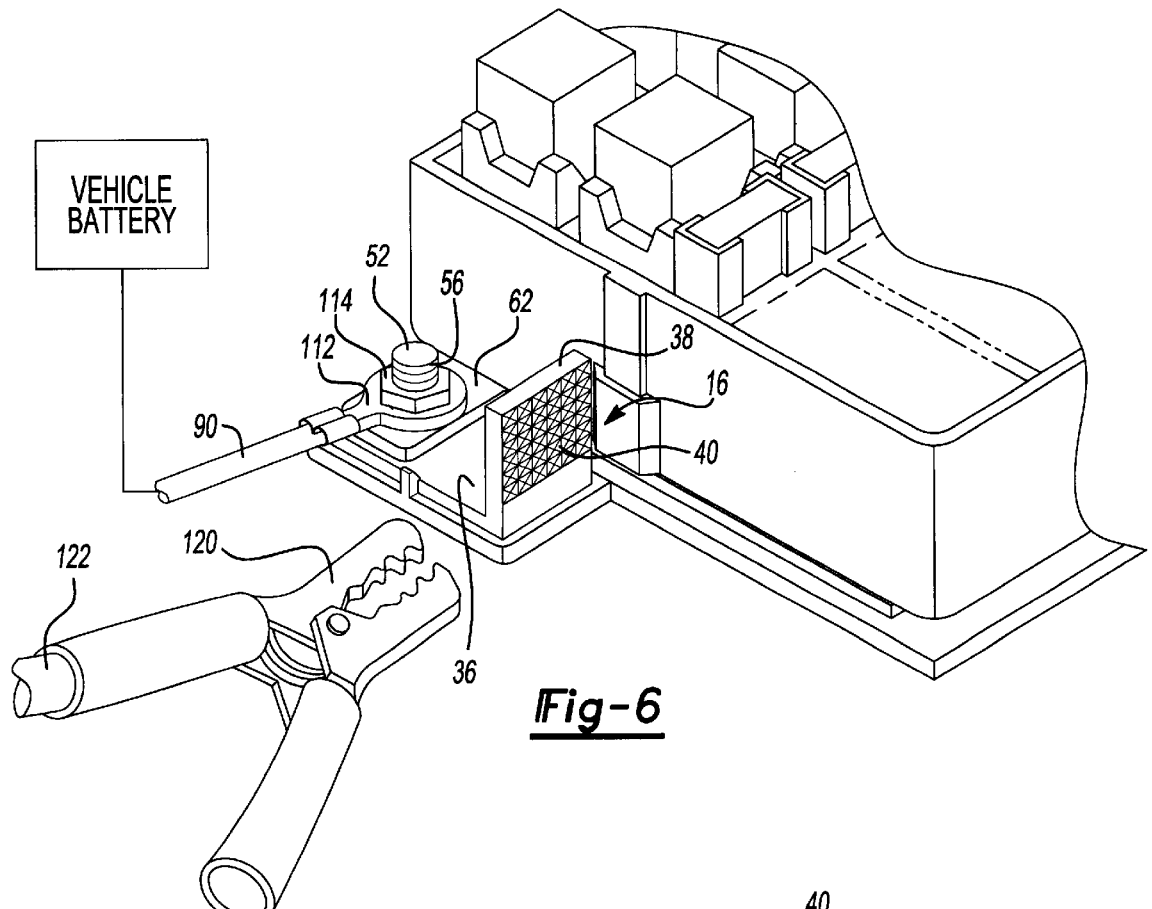
FIG. 6 is a perspective view similar to that of FIG. 1 but illustrating the jaw of a jumper cable as attached to the jump-start terminal.

In FIGS. 4 through 6, the conductive flange 112 of a positive battery cable 90 is shown to be placed over the conductive positive terminal 52 and thereafter to be releasably fixed in this position via a nut 114. The size of the conductive flange 112 is such that it substantially overlies the portion of the bus bar 62 that extends over the base portion 36 of the jump-start terminal 16. The nut 114, which threadably engages the threaded portion 56 of the conductive positive terminal 52, applies a clamping force that clamps the conductive flange 112 of the positive battery cable 90 to the bus bar 62 and the head portion 54 of the conductive positive terminal 52. As the lower and upper cases 60 and 66 are fixedly coupled to one another, and as the lower case 60 and the bus bar 62 extends below and above the head portion 54, respectively, the conductive positive terminal 52 is not free to move to any significant degree in a vertical direction. Furthermore, the magnitude of the clamping force that is produced by the tightening of the nut 114 is relatively higher than that which is attainable in a conventional junction box assembly. More specifically, the maximum torque that is applied to the nut 114 was previously limited by the structure of the junction box, since the head portion of the conductive positive terminal 52 was captured directly by the lower case. In our junction box 14, however, the head portion 54 is captured by the jump-start terminal 16, which is in turn captured by the lower case 60. The jump-start terminal 16, which is relatively stronger than the surrounding plastic material of the lower case 60, effectively distributes the reactive force over a sufficiently large area so as not to overstress the lower case 60, even though a relatively larger installation torque is used. With the positive battery cable 90 attached to the conductive positive terminal 52, the jump-start cover 20 is thereafter secured to the junction box 14, the junction box shroud 12 or the junction box cover 18, as appropriate, to shroud the conductive positive terminal 52 and the jump-start terminal 16.

In the event that the vehicle is involved in a jump-start event (as either the recipient or donor of electrical power), the vehicle operator need only relocate or remove the jump-start cover 20 to expose the jump-start terminal 16 and attach the positive jaw 120 of the jumper cable 122 to the blade portion 38 of the jump-start terminal 16. In the particular embodiment illustrated, the jump-start cover 20 is pivotally coupled to the junction box cover 18 via a hinge mechanism 126 (FIG. 1) having a hinge pin 128 that is integrally formed with the jump-start cover 20 and a pin-engaging flange 130 that is integrally formed with the junction box cover 18. The friction-enhanced faces 40 of the blade portion 38 ensure that the positive jaw 120 fully and securely engages the blade portion 38. The electrical current that is transmitted from vehicle to vehicle during the jump-start event does not pass through the junction box 14; in the particular example provided, the electrical current is transmitted from the jump-start terminal 16 to the bus bar 62 and then to the conductive flange 112 of the positive battery cable 90. Accordingly, the high-current electrical energy of the jump-start event is not transmitted into the junction box 14 rather may passes directly to or from the battery of the vehicle into the other vehicle.

While the invention has been described in the specification and illustrated in the drawings with reference to a preferred embodiment, it will be understood by those skilled in the art that various changes may be made and equivalents may be substituted for elements thereof without departing from the scope of the invention as defined in the claims. In addition, many modifications may be made to adapt a particular situation or material to the teachings of the invention without departing from the essential scope thereof. Therefore, it is intended that the invention not be limited to the particular embodiment illustrated by the drawings and described in the specification as the best mode presently contemplated for carrying out this invention, but that the invention will include any embodiments falling within the foregoing description and the appended claims.

What is claimed is:

1. An electrical junction box assembly comprising:
    a junction box having a lower case, a circuit board and a bus bar, the circuit board including a board member, which is constructed of an electrically insulating material, and a plurality of electrical contacts that are coupled to the board member, the bus bar being in electrical connection with the electrical contacts;
    a mounting aperture formed into one of the lower case and the board member;
    a conductive jump-start terminal having a mounting portion and a blade portion, the mounting portion being received into the mounting aperture such that the one of the lower case and the board member inhibits rotation of the jump-start terminal relative to the junction box, the blade portion having a pair of opposite faces that are generally parallel one another; and
    a conductive positive terminal adapted for electrical connection to a positive conductor of a battery cable, the conductive positive terminal being spaced apart from the blade portion of the jump-start terminal;
        wherein at least one of the positive conductor, the conductive positive terminal and the bus bar is in direct electrically conductive contact with the jump-start terminal such that the circuit board is not exposed to a high-current flow of electrical power during a jump-start event.

2. The electrical junction box assembly of claim 1, wherein the conductive positive terminal is disposed about a terminal axis and the faces of the blade portion are oriented generally parallel the terminal axis.

3. The electrical junction box assembly of claim 2, wherein the jump-start terminal is generally L-shaped.

4. The electrical junction box assembly of claim 1, wherein the conductive positive terminal includes a threaded portion and a head portion and wherein the jump-start terminal includes a coupling aperture that is sized to receive the head portion and wherein the jump-start terminal matingly engages the head portion to substantially inhibit rotation of the conductive positive terminal relative to the junction box.

5. The electrical junction box assembly of claim 4, wherein the threaded portion of the conductive positive terminal extends through the bus bar and the bus bar abuts the head portion and an exterior surface of the jump-start terminal.

6. The electrical junction box assembly of claim 1, wherein the one of the lower case and the board member includes at least one finger, the finger having a tab that is disposed over the mounting aperture, the tab being configured to engage the jump-start terminal to thereby resist removal of the jump-start terminal from the mounting aperture.

7. The electrical junction box assembly of claim 1, wherein a friction enhancing feature is formed on at least one of the faces.

8. The electrical junction box assembly of claim 7, wherein the friction enhancing feature includes a plurality of lines.

9. The electrical junction box assembly of claim 1, further comprising a junction box cover and a jump-start cover, the junction box cover being positionable in a condition that covers a first portion of the junction box, the jump start cover being removably coupled to the junction box cover, the jump-start cover being configured to shroud the conductive positive terminal and the jump-start terminal.

10. A vehicle electrical system comprising:
 a positive battery cable;
 a junction box defining a mounting aperture, the junction box having a bus bar;
 a conductive jump-start terminal disposed in the mounting aperture, the jump-start terminal including a blade portion that is configured to be gripped by a jaw of a jumper cable, the jump-start terminal defining a coupling aperture; and
 a conductive positive terminal having a head portion and a threaded portion, the head portion being disposed in the coupling aperture and matingly engaged to the jump-start terminal to prevent relative rotation therebetween, the threaded portion extending from the head portion and being configured to electrically couple the conductive positive terminal to the positive battery cable, the threaded portion being formed along a terminal axis;
 wherein the threaded portion of the conductive positive terminal extends through the bus bar and wherein
 at least one of the positive conductor, the conductive positive terminal, the bus bar and the positive battery cable is electrically coupled to the jump-start terminal to provide an electrical path between the positive battery cable and the jump-start terminal that does not direct a flow of high-current electrical energy through the junction box during a jump-start event.

11. The vehicle electrical system of claim 10, wherein the blade portion includes a pair of opposite faces that are oriented generally parallel the terminal axis.

12. The vehicle electrical system of claim 11, wherein the jump-start terminal is generally L-shaped.

13. The vehicle electrical system of claim 10, wherein the junction box includes means for retaining the jump-start terminal in the mounting aperture when the positive conductor of the associated battery cable is not coupled to the threaded portion of the conductive positive terminal.

14. The vehicle electrical system of claim 13, wherein the retaining means includes at least one finger, the finger being generally L-shaped and including a resilient leg and a tab that is coupled to a distal end of the resilient leg, the tab overlying a portion of the mounting aperture.

15. The vehicle electrical system of claim 10, wherein a friction enhancing feature is formed on at least one of the exterior surfaces of the blade portion.

16. The vehicle electrical system of claim 15, wherein the friction enhancing feature includes a plurality of lines.

17. The vehicle electrical system of claim 16, wherein the plurality of lines are formed in a stamping operation.

18. The vehicle electrical system of claim 10, further comprising a terminal cover that is removably coupled to the junction box, the terminal cover being configured to shroud the conductive positive terminal and the jump-start terminal.

19. The vehicle electrical system of claim 18, wherein the terminal cover is hingedly coupled to the junction box.

* * * * *